US006937528B2

(12) United States Patent
Hush et al.

(10) Patent No.: US 6,937,528 B2
(45) Date of Patent: Aug. 30, 2005

(54) VARIABLE RESISTANCE MEMORY AND METHOD FOR SENSING SAME

(75) Inventors: Glen Hush, Boise, ID (US); John Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 204 days.

(21) Appl. No.: 10/087,744

(22) Filed: Mar. 5, 2002

(65) Prior Publication Data

US 2003/0169625 A1 Sep. 11, 2003

(51) Int. Cl.$^7$ ................................................ G11C 7/00
(52) U.S. Cl. .................................. 365/189.07; 365/203
(58) Field of Search .......................... 365/189.07, 204, 365/203, 212, 105, 115, 196, 230, 207, 243, 230.05

(56) References Cited

U.S. PATENT DOCUMENTS

| | | |
|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |

(Continued)

FOREIGN PATENT DOCUMENTS

| | | |
|---|---|---|
| JP | 56126916 A | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Yoji Kawamoto et al., "Ionic Conduction in $As_2S_3$–$Ag_2S$, $GeS_2$–$GeS$–$Ag_2S$ and $P_2S_5$–$Ag_2S$ Glasses," Journal of Non–Crystalline Solids 20 (1976), pp. 393–404.

Abdel–Ali, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

(Continued)

*Primary Examiner*—Thong Q. Le
(74) *Attorney, Agent, or Firm*—Dickstein Shapiro Morin & Oshinsky LLP

(57) ABSTRACT

A sense circuit and method for reading a resistance level of a programmable conductor memory element are provided. All rows and columns in a given memory array are initially held to the same potential. A desired row line is enabled by bringing it to approximately ground. The difference in voltage potential across a diode circuit of a selected cell activates the diodes and initiates current flow through the desired memory element of the desired cell. A column line associated with the cell is discharged from a precharge value through the diode circuit and memory element. The discharging voltage at the column line is compared with a reference voltage. If the voltage at the column line is greater than the reference voltage, then a high resistance level is detected, and, if the column line voltage is less than the reference voltage, a low resistance level is detected.

70 Claims, 9 Drawing Sheets

U.S. PATENT DOCUMENTS

| | | |
|---|---|---|
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,805,148 A * | 2/1989 | Diehl-Nagle et al. ....... 365/154 |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A * | 10/1998 | Harshfield ................. 365/105 |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,883,827 A | 3/1999 | Morgan |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B2 | 1/2003 | Hudgens et al. |
| 6,511,867 B2 | 1/2003 | Lowery et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,535,347 B1 * | 3/2003 | Wakuda .................. 360/77.03 |
| 6,545,287 B2 | 4/2003 | Chiang |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |

| | | |
|---|---|---|
| 6,673,648 B2 | 1/2004 | Lowrey |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 2002/0000666 A1 | 1/2002 | Kozicki et al. |
| 2002/0050606 A1 * | 5/2002 | Buerger, Jr. ............... 257/202 |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki et al. |
| 2002/0168852 A1 | 11/2002 | Harshfield et al. |
| 2002/0190289 A1 | 12/2002 | Harshfield et al. |
| 2002/0190350 A1 | 12/2002 | Kozicki |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0156447 A1 | 8/2003 | Kozicki |
| 2003/0156463 A1 | 8/2003 | Casper et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

OTHER PUBLICATIONS

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi, M.A.; Labib, H.H.; Fouad, S.S.; El–Shazly, A.A., Electrical & thermal conductivity of the amorphous semi-conductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe51: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–xSe1+x thin film structures, Phys. Stat. Sol. (a) 74 (1982) 217–224.

Bondarev, V.N.; Pikhitsa, P.V., A dendrite model of current instability in RbAg415, Solid State Ionics 70/71 (1994) 72–76.

Boolchand, P., The maximum in glass transition temperature (Tg) near x=⅓ in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Opto-electronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1-x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.-M.; Schmitz, C.; Chemyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.

Chen, C.H.; Tai, K.L. , Whisker growth induced by Ag photodoping in glassy GexSe1-x films, Appl. Phys. Lett. 37 (1980) 1075–1077.

Chen. G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Stucture of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2–xSe1+x/n–Si diodes, Thin Solid Films 110 (1983) 107–113.

El Gharras, Z.; Bourahla, A.; Vautier, C., Role of photoinduced defects in amorphous GexSe1-x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80-x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X. ;Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.-P.; Rouxel, T.; Keryvin, V.; Sangleboeuf, J.-C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.-P.; Rouxel, T.; Sangleboeuf, J.-C; Meiscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of $Ag_x(GeSe_3)_{1-x}$ ($0<=x<=0.571$) glasses, Solid state Ionics 123 (1999) 259–269.

Kluge, G.; Thomas, A.; Klabes, R.; Grotzschel, R., Silver photodiffusion in amorphous $Ge_xSe_{100-x}$, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in $GexSe_{1-x}$ glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L., Reversible and irreversible electrical switching in TeO2–V2O5 based glasses, Journal de Physique IV 2 (1992) C2–185–C2–188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Mitkova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in $(Ag_xCu_{1-x})_2Se$, J. Phys. Soc. Japan 34 (1973) 423–432.

Miyatani, S.–y., Electrical properties of $Ag_2Se$, J. Phys. Soc. Japan 13 (1958) 317.

Miyatani, S.–y., Ionic conduction in beta–$Ag_2Te$ and beta–$Ag_2Se$, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakama, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of $Ge_xSe_{1-x}$ amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J., Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose,M.J.; Hajto,J.;Lecomber,P.G.;Gage,S.M.;Choi,W.K.; Snell,A.J.;Owen,A.E., Amorphous silicon analogue memory devices, J. Non–Cryst. Solids 115 (1989) 168–170.

Rose,M.J.;Snell,A.J.;Lecomber,P.G.;Hajto,J.;Fitzgerald, A.G.;Owen,A.E., Aspects of non–volatility in a –Si:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in $Ge_xSe_{1-x}$ and $As_xSe_{1-x}$ systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C.; Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov,P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag 0.40|Ag System prepared by photodissolution of Ag. J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope|dTg/d<m>|at the rigidity percolation threshold (<m>=2.4), J. Non–Cryst. Solids 151 (1992) 149–154.

Axon Technologies Corporation, Technology Description: *Programmable Metalization Cell(PMC)*, pp. 1–6 (Pre–May 2000).

Helbert et al., *Intralevel hybrid resist process with submicron capability*, SPIE vol. 333 Submicron Lithography, pp. 24–29 (1982).

Hill, Dissertation: *Materials characterization of Silver Chalcogenide Programmable Metalization Cells*, Arizona State University, pp. Title p. 114 (UMI Company, May 1999).

Hirose et al., *High Speed Memory Behavior and Reliability of an Amorphous $As_2S_3$ Film Doped Ag*, Phys. Stat. Sol. (a) 61, pp. 87–90 (1980).

Holmquist et al., *Reaction and Diffusion in Silver–Arsenic Chalcogenide Glass Systems*, 62 J. Amer. Ceram. Soc., No. 3–4, pp. 183–188 (Mar.–Apr. 1979).

Huggett et al., *Development of silver sensitized germanium selenide photoresist by reactive* sputter etching in $SF_6$, 42 Appl. Phys. Lett., No. 7, pp. 592–594 (Apr. 1983).

Kawaguchi et al. *Mechanism of photosurface deposition*, 164–166 J. Non–Cryst, Solids, pp. 1231–1234 (1993).

Kolobov and Elliott, Photodoping of Amorphous Chalcogenides by Metals, Advances in Physics, vol. 40, No. 5, 625–684 (1991).

Kozicki, et al., "Applications of Programmable Resistance Changes in Metal–doped Chalcogenides", Proceedings of the 1999 Symposium on Solid State Ionic Devices, Editors—E.O. Wachsman et al., The Electrochemical Society, Inc., 1–12 (1999).

Kozicki, et al., *Nanoscale effects in devices based on chalcogenide solid solutions*, Superlattices and Microstructures, 27, 485–488 (2000).

Kozicki, et al., *Nanoscale phase separation in Ag–Ge–Se glasses*, Microelectronic Engineering, vol. 63/1–3,155–159 (2002).

M.N. Kozicki and M. Mitkova, *Silver incorporation in thin films of selenium rich Ge–Se glasses*, Proceedings of the XIX International Congress on Glass, Society for Glass Technology, 226–227 (2001).

McHardy et al., *The dissolution of metals in amorphous chalcogenides and the effects o electron and ultraviolet radiation*, 20 J. Phys. C.; Solid State Phys., pp. 4055–4075 (1987).

Owen et al., *Metal–Chalcogenide Photoresists for High Resolution Lithography and Sub–Micron Structures*, Nanostructure Physics and Fabrication, pp. 447–451 (M. Reed ed. 1989).

Shimizu et al., *The Photo–Erasable Memory Switching Effect of Ag Photo–Doped Chalcogenide Glasses*, 46 B. Chem. Soc. Japan, No. 12, pp. 3662–3365 (1973).

Michael N. Kozicki, 1. *Programmable Metallization Cell Technology Description*, Feb. 18, 2000.

Michael N. Kozicki, Axon Technologies Corp. and Arizona State University, Presentation of Micron Technology, Inc., Apr. 6, 2000.

* cited by examiner

VARIABLE RESISTANCE MEMORY AND METHOD FOR SENSING SAME

BACKGROUND OF THE INVENTION

1. Field of the Invention

The present invention relates to integrated memory circuits. More specifically, it relates to a method for sensing the content of a programmable conductor random access memory (PCRAM) cell.

2. Description of Prior Art

DRAM integrated circuit arrays have existed for more than thirty years and their dramatic increase in storage capacity has been achieved through advances in semiconductor fabrication technology and circuit design technology. The tremendous advances in these two technologies have also achieved higher and higher levels of integration that permit dramatic reductions in memory array size and cost, as well as increased process yield.

A DRAM memory cell typically comprises, as basic components, an access transistor (switch) and a capacitor for storing a binary data bit in the form of a charge. Typically, a charge of one polarity is stored on the capacitor to represent a logic HIGH (e.g., binary "1"), and a stored charge of the opposite polarity represents a logic LOW (e.g., binary "0"). The basic drawback of a DRAM is that the charge on the capacitor eventually leaks away and therefore provisions must be made to "refresh" the capacitor charge or else the data bit stored by the memory cell is lost.

The memory cell of a conventional SRAM, on the other hand, comprises, as basic components, an access transistor or transistors and a memory element in the form of two or more integrated circuit devices interconnected to function as a bistable latch. An example of such a bistable latch is cross-coupled inverters. Bistable latches do not need to be "refreshed," as in the case of DRAM memory cells, and will reliably store a data bit indefinitely as long as they continue to receive supply voltage.

Efforts continue to identify other forms of non-volatile or semi-volatile memory elements. Recent studies have focused on resistive materials that can be programmed to exhibit either high or low stable ohmic states. A programmable resistance element of such material could be programmed (set) to a high resistive state to store, for example, a binary "1" data bit or programmed to a low resistive state to store a binary "0" data bit. The stored data bit could then be retrieved by detecting the magnitude of a readout current switched through the resistive memory element by an access device, thus indicating the stable resistance state it had previously been programmed to.

Recently programmable conductor memory elements have been devised. For example, chalcogenide glasses which have switchable resistive states have been investigated as data storage memory cells for use in memory devices, such as DRAM memory devices. U.S. Pat. Nos. 5,761,115, 5,896,312, 5,914,893, and 6,084,796 all describe this technology and are incorporated herein by reference. One characteristic of a programmable conductor memory element such as one formed of the chalcogenide glasses described above is that it typically includes chalcogenide glass which can be doped with metal ions and a cathode and anode spaced apart on one or more surfaces of the glass. The doped glass has a normal and stable high resistance state. Application of a voltage across the cathode and anode causes a stable low resistance path to occur in the glass. Thus, stable low and high resistance states can be used to store binary data.

A programmable conductor memory element formed of a doped chalcogenide glass material typically has a stable high resistance state which may be programmed to a low resistance state by applying a voltage across the memory element. To restore the memory cell to a high resistive state, typically one needs to program the cell with a negative, or inverse voltage which is equal to or greater that the voltage used to program the memory element to the low resistance state. One particularly promising programmable conductor chalcogenide glass has a Ge:Se glass composition and is doped with silver.

Suitable circuitry for reading data from an array of programmable conductor memory elements has not yet been fully developed. Accordingly, in order to realize a functional programmable conductor memory, appropriate read circuitry is required to nondestructively sense data stored in the memory elements of the array.

SUMMARY OF THE INVENTION

The present invention provides a sense circuit and method for reading a resistance level of a programmable conductor memory element. In an exemplary embodiment, each programmable conductor memory cell contains a programmable conductor memory element and is coupled between a column line and a word line through a pair of reversely connected diodes, also referred to as an isolation diode pair. In operation, all rows and columns in a given memory array are initially held to the same potential (e.g., a diode threshold voltage plus an additional predetermined voltage). A desired row line connected to a cell to be selected is enabled by bringing it to approximately ground. The difference in voltage potential across the isolation diode pair of a selected cell activates the diodes and initiates current flow through the desired programmable conductor element. A column line associated with the selected cell is then discharged from a precharge value through the diodes and programmable conductor memory element. The discharging voltage at the column line is compared with a reference voltage a predetermined time after the row line is brought to approximately ground. If the voltage at the column line is greater than the reference voltage, then a high resistance level is recognized, and, if the column line voltage is less than the reference voltage, a low resistance level is detected. The high and low resistance states represent binary data values, i.e., the logical state of the memory element.

In an alternative embodiment of the invention, a single zener diode call be used in place of the isolation diode pair.

Once the logical state of the programmable conductor element is read, a refresh operation may optionally be conducted on a memory element programmed to a low resistance state by placing voltage sufficient for programming across the memory element by either increasing the row line voltage or by raising the column line voltage. The programmable conductor element is then re-programmed to its existing logical state and all rows and columns are then returned to their initial operating state for the next operation.

BRIEF DESCRIPTION OF THE DRAWINGS

The foregoing and other advantages and features of the invention will become more apparent from the detailed description of preferred embodiments of the invention given below with reference to the accompanying drawings in which.

DETAILED DESCRIPTION OF PREFERRED EMBODIMENTS

The present invention will be described as set forth in exemplary embodiments described below in connection with FIGS. 1–11. Other embodiments may be realized and other changes may be made to the disclosed embodiments without departing from the spirit or scope of the present invention.

Figure 1:
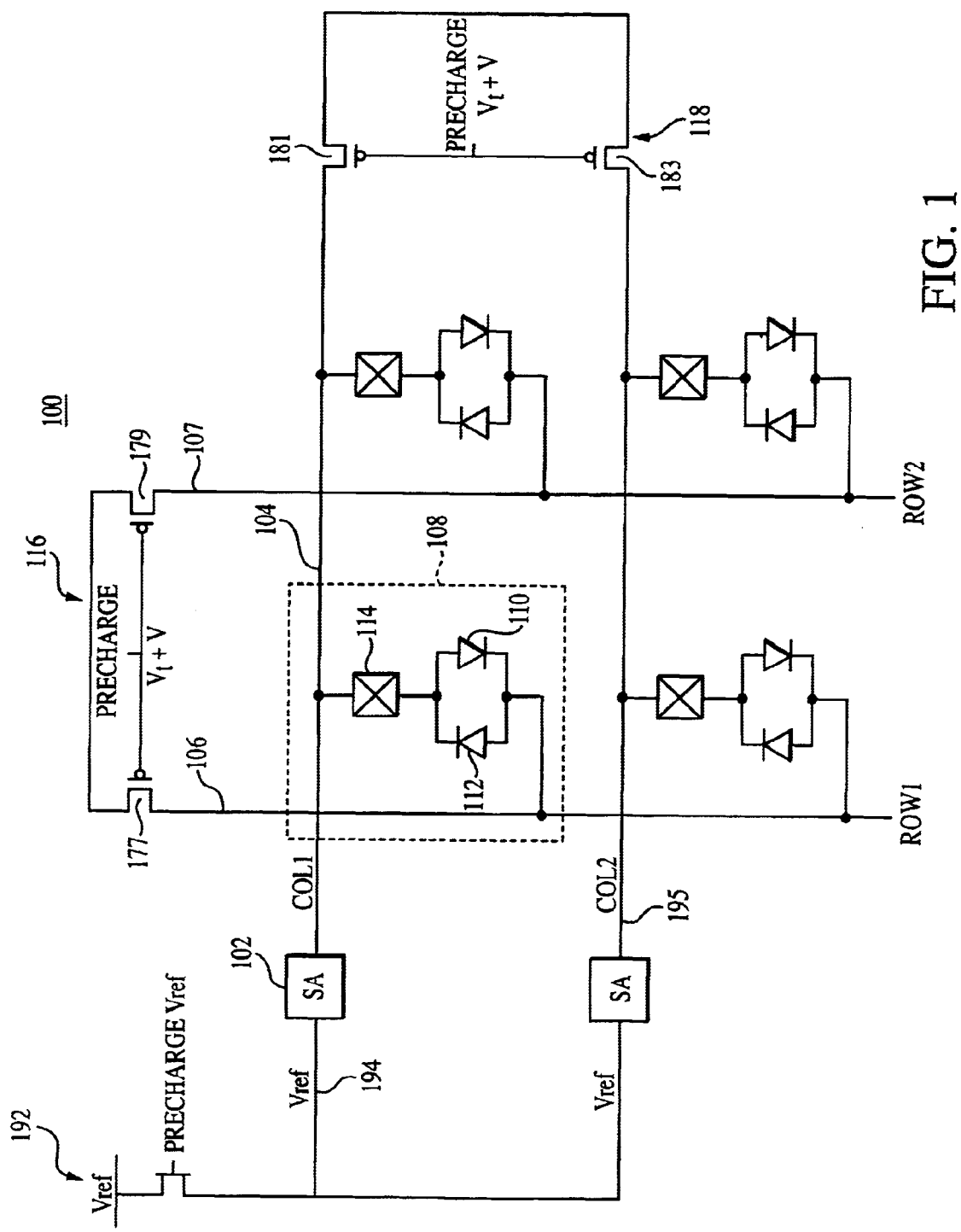
FIG. 1 depicts a memory, array employing a plurality of PCRAM memory cells, in accordance with an exemplary embodiment of the invention.

FIG. 1 depicts a memory array 100 containing a plurality of PCRAM memory cells (e.g., 108). Memory array 100 also includes a plurality of column (bit) lines (e.g., 104), row lines (e.g., 106) and sense amplifiers (e.g., 102). Also depicted in memory array 100 is a first precharge circuit 116 for precharging all row lines to a common initial voltage (e.g., a diode threshold voltage Vt plus a predetermined voltage V (e.g., 0.2v)) and a second precharge circuit 118 for precharging all column lines to the same predetermined voltage as the row lines (e.g., Vt+V). For reasons of simplicity, only two row lines and two column lines are depicted as being respectively coupled to the precharge circuits 116, 118. Precharge circuit 116 contains a first transistor 177 and a second transistor 179. A first source/drain terminal of transistor 177 is coupled to a first source/drain terminal of transistor 179. A gate terminal of transistor 177 is coupled to a gate terminal of transistor 179 and also to a voltage source for providing the precharge voltage (Vt+V). The second source/drain terminals of transistors 177, 179 are respectively coupled to row lines 106, 107. When the precharge signal is received by the precharge circuit 116, all rows are precharged to the predetermined voltage (e.g., Vt+V).

Similarly, with respect to the second precharge circuit 118, a first source/drain terminal of transistor 181 is coupled to a first source/drain terminal of transistor 183. A gate terminal of transistor 181 is coupled to a gate terminal of transistor 183 and also to a voltage source for providing the precharge voltage (Vt+V). The second source/drain terminals of transistors 181, 183 are respectively coupled to column lines 104, 195. Both precharge circuits 116 and 118 may also contain equilibrate circuits, which are not shown for purposes of simplicity.

Each memory cell 108 contains a programmable conductor memory element 114, a first terminal of which is coupled to column line 104. A second terminal of programmable conductor memory element 114 is coupled to one side of a pair of reverse connected diodes 110, 112 which form an isolation diode pair. The isolation diode pair 110, 112 is also coupled at the other side to row line 106. Each sense amplifier contains two inputs: a first input is received from an associated column line 104 and a second input is received from a Vref line 194 coupled to Vref precharge circuit 192 for precharging the Vref line 194 to Vref when a read operation is initiated. Alternatively, the Vref line 194 may be coupled to precharge circuit 116 and then modified from Vt+V to Vref (e.g., decreased from Vt+0.2V to a lower value such as Vt+0.1V) with a voltage adjusting circuit as known in the art.

Figure 2A:
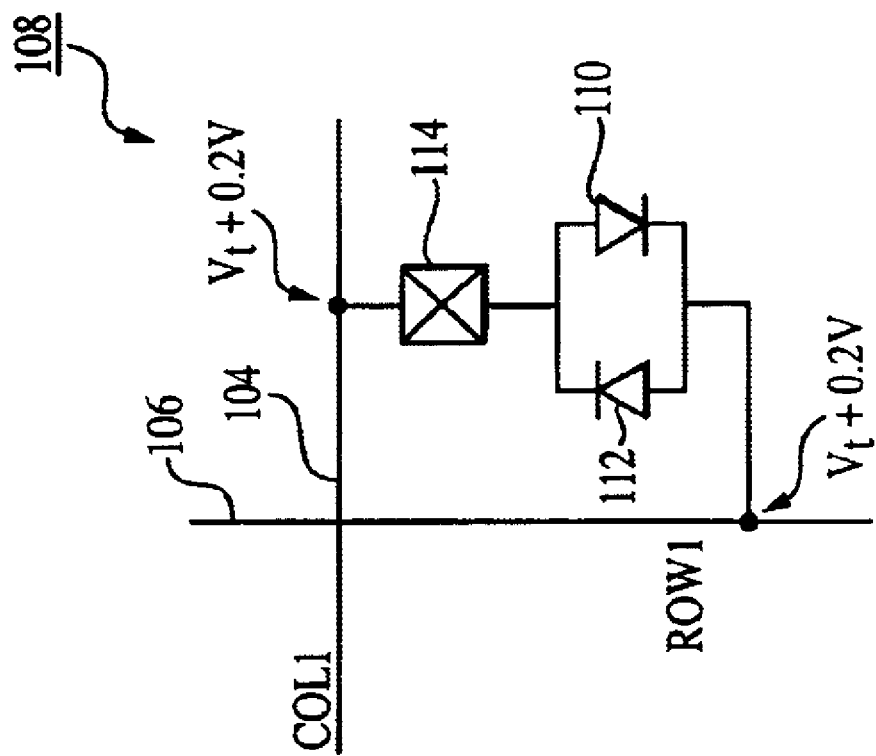
FIG. 2(a) depicts a PCRAM memory cell of FIG. 1 in an isolated state, in accordance with an exemplary embodiment of the invention.

Turning to FIG. 2(a), a simplified schematic diagram of the memory cell 108 is depicted. Memory cell 108 is associated with column line 104 and row line 106. One terminal of the programmable conductor memory element 114 is coupled to column line 104. Another terminal of programmable conductor memory element 114 is coupled to an input of diode 110 and an output of diode 112. An output of diode 110 is coupled to an input of diode 112 and also coupled to row line 106. In accordance with an exemplary embodiment of the invention, to initialize a read operation, both column line 104 and row line 106 are held to the same voltage (e.g., Vt+V). In fact, in an initial state of the memory array 100 prior to a read operation, all row lines and all column lines are held to the same voltage (e.g., Vt+V), thereby preventing any current flow in any memory cell.

Figure 2B:
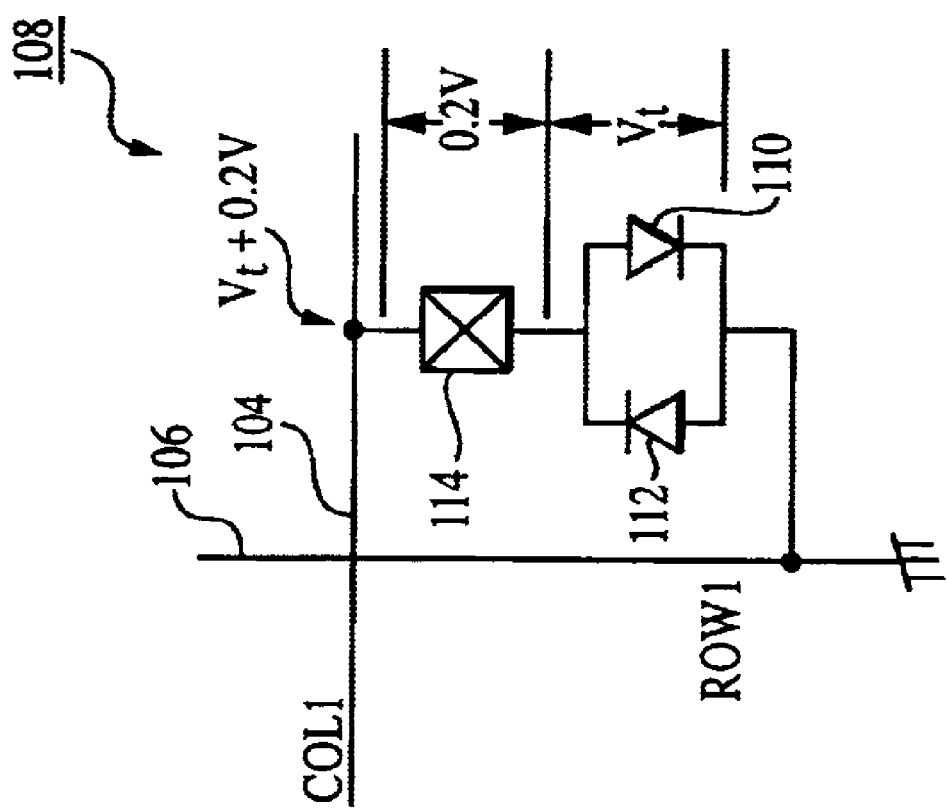
FIG. 2(b) depicts a PCRAM memory cell of FIG. 1 in a selected state, in accordance with an exemplary embodiment of the invention.

Turning to FIG. 2(b), voltages applied during a read operation of memory cell 108 are depicted. For the read operation the column line 104 of memory cell 108 remains at the initial predetermined voltage (e.g., Vt+V), however, a selected row line is brought to approximately zero volts (e.g., ground). Bringing row line 106 to approximately zero volts creates a voltage potential difference across the memory cell 108. As a result of the voltage potential difference across memory cell 108, diode 110 begins to conduct and current flows from column line 104 to row line 106 through the programmable conductor memory element 114. When current begins to flow from column line 104 to row line 106, the voltage at column line 104 begins to discharge and there is a voltage drop of Vt (e.g., 0.3 volts) across the diode pair 110, 112. Assuming that V=approximately 0.2 v, a voltage potential of approximately 0.2 volts remains across the programmable conductor memory element 114. A voltage of approximately 0.2v is sufficient to read the resistance of the programmable conductor memory element 114, but insufficient to program or change a resistance state of the memory element 114.

The initial voltage to which the column line (e.g., 104) and row line (e.g., 106) are precharged (Vt+V) is selected so that when the row line is brought to approximately zero volts the voltage remaining across the programmable conductor memory element 114 is sufficiently high enough to read the contents of programmable conductor memory element 114, but insufficient to program the programmable conductor memory element 114. It should be readily apparent that although specific voltages are described above in connection with the read operation, other voltage combinations may be used as long as a read voltage is applied across the memory element 114 which is sufficient to read the element, but insufficient to program it to a particular resistance state.

Figure 3A:
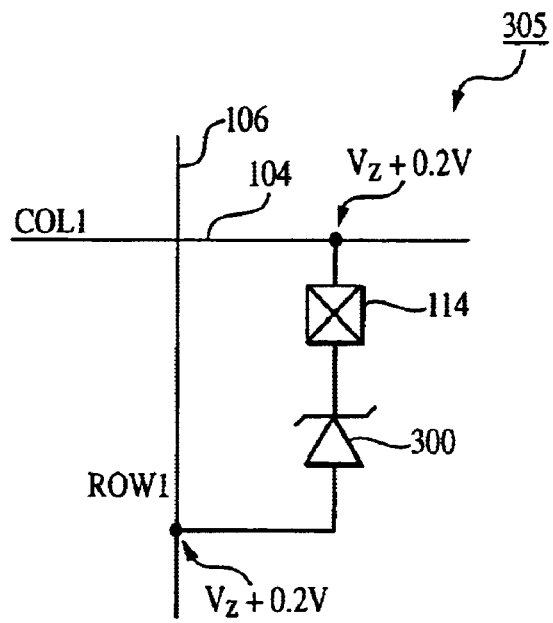
FIG. 3(a) depicts an alternative PCRAM memory cell in an isolated state, in accordance with an exemplary embodiment of the invention.

Turning to FIG. 3(a), an alternative embodiment for the PCRAM cell 108 is depicted. PCRAM cell 305 is identical to PCRAM cell 108; however, PCRAM cell 305 contains a single zener diode 300 rather than a reverse connected diode pair 110, 112. Using a single zener diode 300 has some inherent advantages over a reverse connected diode pair 110, 112 including the fact that a memory cell containing a zener diode 300 has a less complex construction. In addition, since the zener diode's 300 breakdown voltage is much greater than that of a conventional diode, it provides greater stability over a wider voltage range. The greater stability means the diode is less susceptible to being activated by system noise or similar interference.

Figure 4:
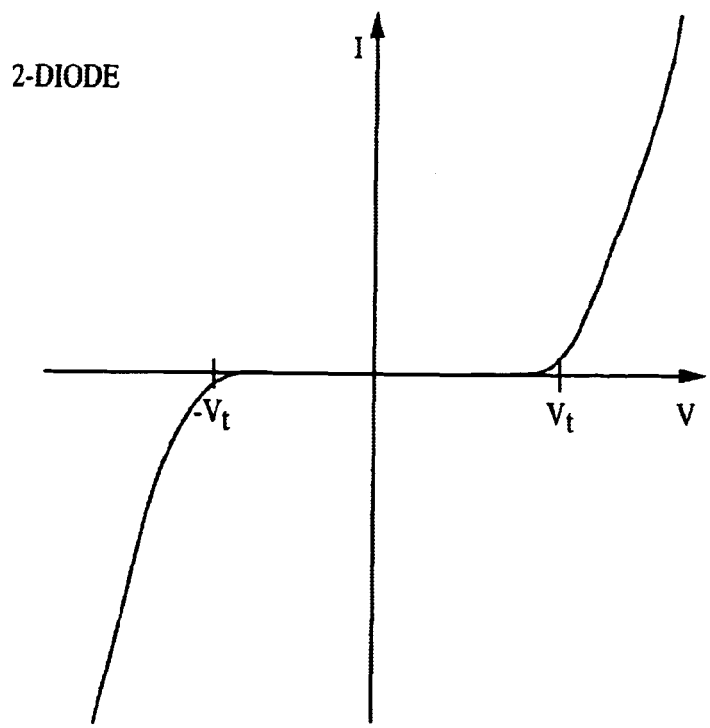
FIG. 4 depicts a voltage vs. current curve for the PCRAM cell of FIGS. 2(a) and 2(b), in accordance with an exemplary embodiment of the invention.
Figure 5:
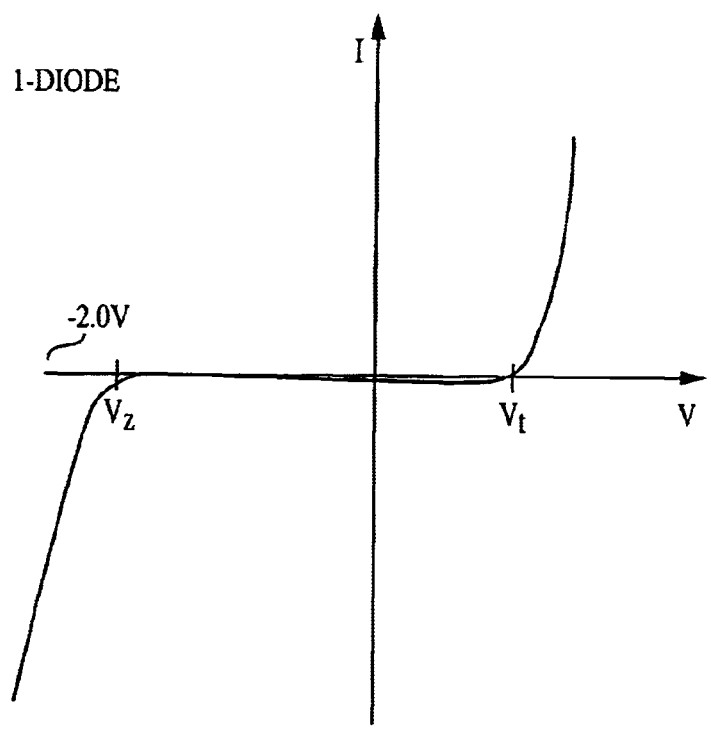
FIG. 5 depicts a voltage vs. current curve for the PCRAM cell of FIGS. 2(a) and 2(b), in accordance with an exemplary embodiment of the invention.

As shown in FIG. 4, that range of stability for the reverse connected diode pair 110, 112 is approximately 0.6 volts (i.e., from −0.3v to +0.3v). However, as further shown in FIG. 5, the range of stability is much wider at higher voltages, such as approximately 2.3 volts where the range of stability is from −2.0v to +0.3v. Although the zener diode 300 configuration has several advantages including greater stability, less complex construction, etc., it still requires a greater operational voltage than may be desired in certain applications. Therefore, either the diode pair 110, 112 configuration or the zener diode 300 configuration may be used depending on the characteristics of the particular circuit within which the memory array 100 operates.

For purposes of this description, it will be assumed that the zener voltage Vz is approximately −2.0 volts. As described above, the initial voltage to which all columns and rows are set must be approximately equal. In this case, the initial voltage to which all columns (e.g., 104) and rows (e.g., 106) are set must be approximately Vz+V (e.g., approximately −2.2 volts). As depicted in FIG. 3(a), initially, column line 104 and row line 106 are charged to the same voltage, e.g., Vz+0.2v and therefore there is a voltage potential difference across memory cell 305 of approximately 0v and no current flows through programmable conductor memory element 114.

Figure 3B:
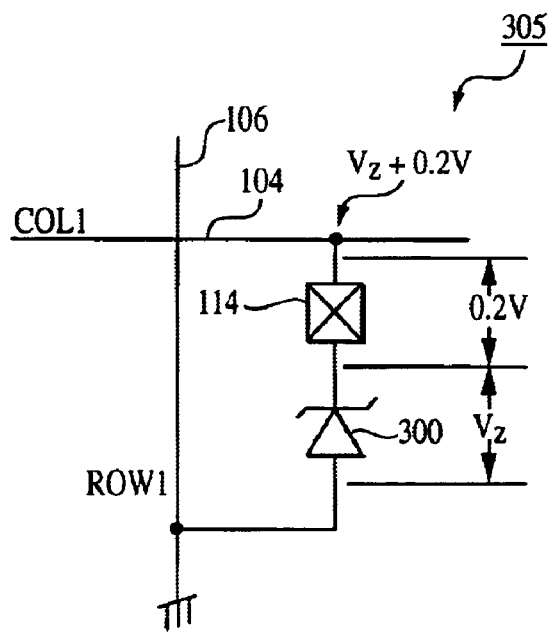
FIG. 3(b) depicts an alternative PCRAM memory cell in a selected state, in accordance with an exemplary embodiment of the invention.

Turning to FIG. 3(b), a read operation is depicted whereby row line 106 is brought to ground, thereby introducing a large voltage potential difference across memory cell 305 and current begins to flow through the programmable conductor memory element 114. For example, when row line 106 is brought to zero volts a difference of potential of Vz (e.g., −2.0v) is registered across zener diode 300 leaving a voltage drop of approximately 0.2 v across programmable conductor memory element 114. As described above, approximately 0.2 v is sufficient to read the contents of the memory element 114; however, it is insufficient to program the memory element 114.

Figure 6:
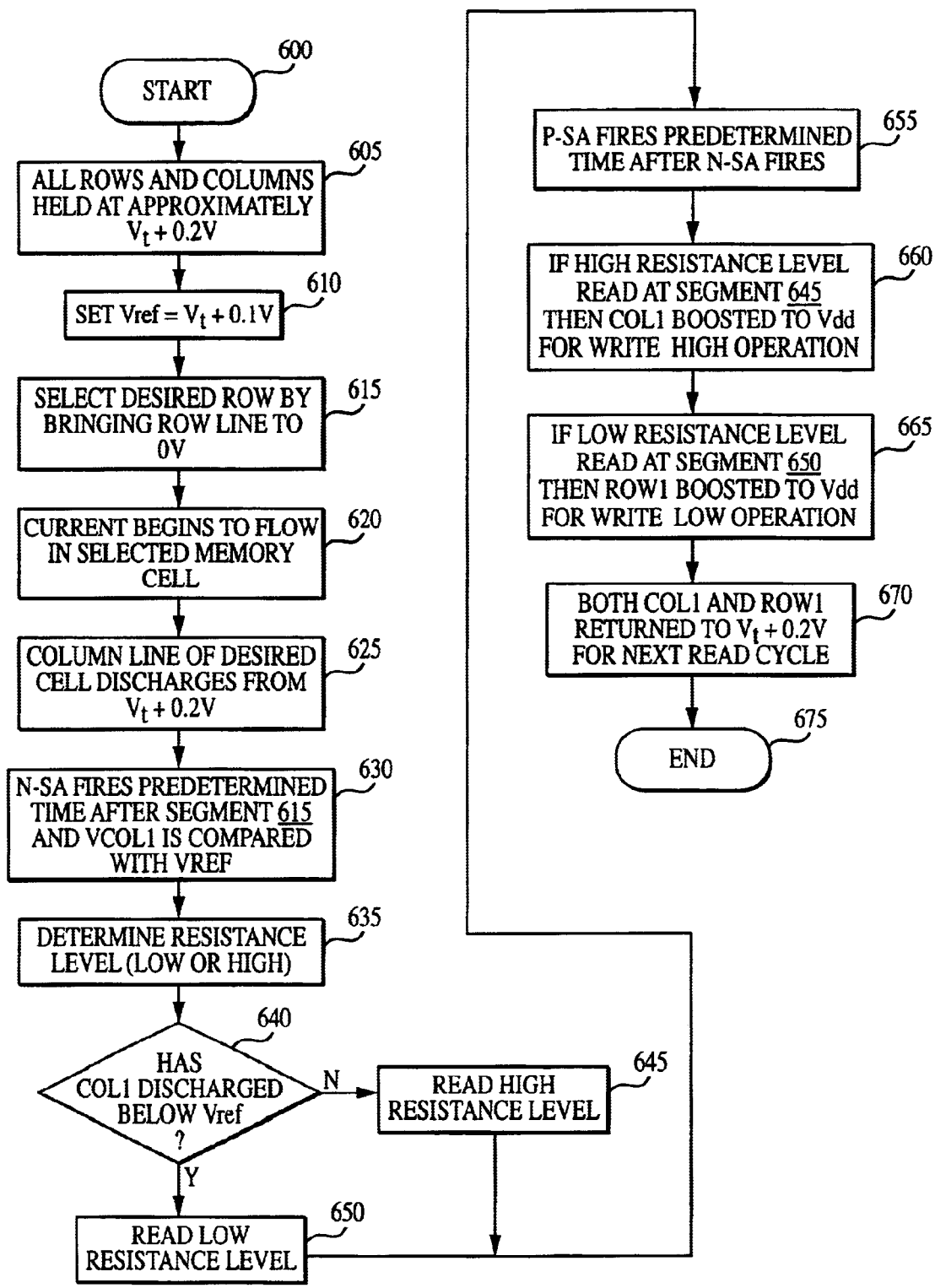
FIG. 6 depicts a flowchart providing a process flow of a read operation in accordance with an exemplary embodiment of the present invention.

FIG. 6 depicts a flow chart of an operational flow for performing a read operation on a memory cell (e.g., 108), in accordance with exemplary embodiments of the invention. At segment 600, the process flow begins. At segment 605, all rows and columns are held to an initial voltage (e.g., Vt+V, where V is a voltage suitable for reading a memory element, but insufficient to program it; one exemplary V value as described above is 0.2 volts). The initial voltage may be introduced to all rows and columns via precharge circuits 116 and 118. This mar be followed by equilibrating the voltages at the rows and columns. At segment 610, a reference voltage Vref for a sense amplifier 102 connected to a selected column is set to approximately Vt+0.1v (assuming V=0.2v). At segment 615, a desired row is selected by bringing the row line 106 voltage to approximately zero volts (e.g., ground). At segment 620, current begins to flow in the selected memory cell associated with the row line, 106. At segment 625, the voltage on the column line, e.g., 104, of the desired cell 108 discharges from approximately Vt+V through the memory element 114 to the grounded row line. At segment 630, an N-sense amplifier portion (700 of FIG. 7) of sense amplifier 102 is enabled a predetermined time (e.g., 10–20 ns) after segment 615 brings the desired row line voltage to approximately zero volts. At segment 635, the resistance level of memory cell 108 is initially recognized by comparing the voltage at column line 104 with Vref when the N-sense amplifier 700 is enabled. At segment 640, a determination is made as to whether column line 104 voltage had discharged below Vref. If yes, at segment 650, the voltage at column line 104 is driven to approximately ground and a low resistance level is recognized at the programmable conductor memory element 114. If not, at segment 645, a high resistance level is recognized at the programmable conductor memory element 114.

At segment 655, a P-sense amplifier portion (800 of FIG. 8) of sense amplifier 102 is enabled a predetermined time (e.g., 10 ns) after the N-sense amplifier 700 is enabled at segment 630. At segment 660, if a high resistance level was recognized at segment 645, column line 104 is boosted to approximately Vdd and a logic HIGH state is read for the programmable conductor memory element 114. If a low resistance level was recognized at segment 650, a logic LOW state is read for the programmable conductor memory element 114.

If a low resistance level (e.g., logic LOW state) is read for the programmable conductor memory element 114 at segment 665, the row line 106 is boosted to approximately Vdd so as to introduce a voltage potential across the programmable conductor memory element 114 sufficient to program the low resistance level back into the element. That is, by boosting the row line 106 voltage to Vdd while the voltage at the column line 104 is approximately grounded, a voltage sufficient to program the programmable conductor memory element 114 is introduced across the element 114. At segment 670, all column lines and all row lines are returned to the same initial voltage (e.g., Vt+V) for the next read cycle. The process flow ends at segment 675.

Figure 7:
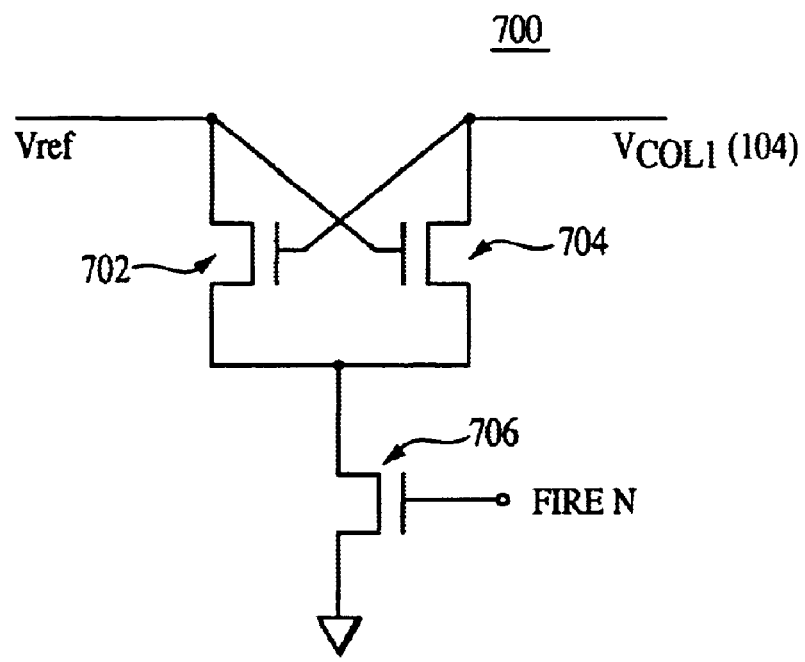
FIG. 7 depicts an N-sense amplifier of the FIG. 1 memory array, in accordance with an exemplary embodiment of the invention.

Turning to FIG. 7, an N-sense amplifier portion 700 of sense amplifier 102 (of FIG. 1) is depicted. N-sense amplifier 700 contains two inputs. A first input receives Vref. A second input receives the voltage at column line 104. The first input (from Vref) is coupled to a first source/drain terminal of a complimentary metal oxide semiconductor (CMOS) transistor 702 and also coupled to a gate of CMOS 704. The second input of N-sense amplifier 700 is coupled to a source/drain terminal of CMOS 704 and a gate of CMOS 702. A second source/drain terminal of CMOS 702 is coupled to a second source/drain terminal of CMOS 704, and both in turn are coupled to a first source/drain terminal of CMOS 706. A gate of CMOS 706 receives a Fire N control signal, the receipt of which enables the N-sense amplifier 700 to determine whether the voltage of column line 104 is greater or less than Vref. A second source/drain terminal of CMOS 706 is coupled to ground.

During operation of N-sense amplifier 700, if the voltage at column line 104 is greater than Vref, then CMOS 704 is off and CMOS 702 is on and Vref is driven to ground and the voltage at column line 104 remains floating while discharging from its initial level of Vt+V.

Alternatively, if the voltage at column line 104 is less than Vref, then CMOS 704 is on and CMOS 702 is off, and the voltage at column line 104 is driven to ground and Vref remains steady.

Figure 8:
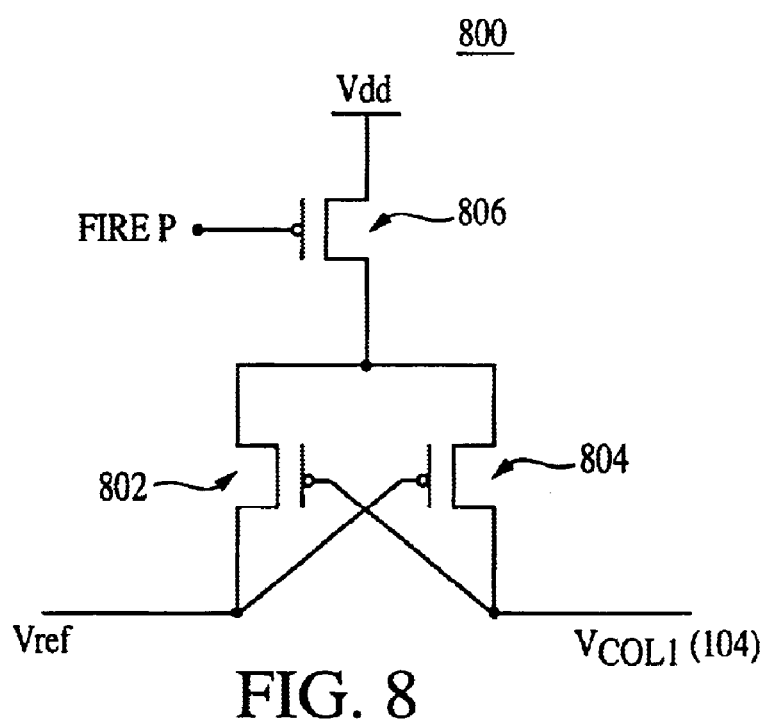
FIG. 8 depicts a P-sense amplifier of the FIG. 1 memory array, in accordance with an exemplary embodiment of the invention.

Turning now to FIG. 8, a P-sense amplifier portion 800 of sense amplifier 102 (of FIG. 1) is depicted. A first input of P-sense amplifier 800 receives Vref, and a second input receives the voltage at column line 104. A first source/drain terminal of CMOS 802 is coupled to Vref. A gate of CMOS 804 is also coupled to Vref. The voltage at column line 106 is coupled to a gate of CMOS 802 and also coupled to a first source/drain terminal of CMOS 804. A second source/drain terminal of CMOS 802 is coupled to a first source/drain terminal of CMOS 806 and a second source/drain terminal of CMOS 804 is also coupled to the same source/drain terminal of CMOS 806. A second source/drain terminal of CMOS 806 is coupled to a predetermined voltage level (e.g., Vdd). A gate of CMOS 806 receives a Fire P control signal, the receipt of which enables the P-sense amplifier 800 to further compare its input voltages.

During operation, the P-sense amplifier 800 is enabled a predetermined time after the N-sense amplifier 700 is enabled. That is, an initial determination has already been made as to whether the voltage at column line 104 is greater than or less than Vref and one of the voltages at column line 104 and Vref has been driven to ground. For example, if the voltage at column 104 was less than Vref for the input of N-sense amplifier 700, then the column line input to the N-sense amplifier 700 would have been driven to ground and would thus be considered a logic LOW for purposes of the input to P-sense amplifier 800. Vref would remain at its initial voltage. As a result, CMOS 804 would be inactive and CMOS 802 would be active, thus, increasing Vref to a predetermined voltage level (e.g., Vdd). If, however, as described above the voltage at column line 104 is greater than Vref, then Vref has been driven to ground and the column line input to the P-sense amplifier would be considered a logic HIGH and Vref would be considered a logic LOW. In this case, CMOS 802 would be off and CMOS 804 would be on and the voltage at column line 104 would be driven to the predetermined voltage (e.g., Vdd).

Figure 9:
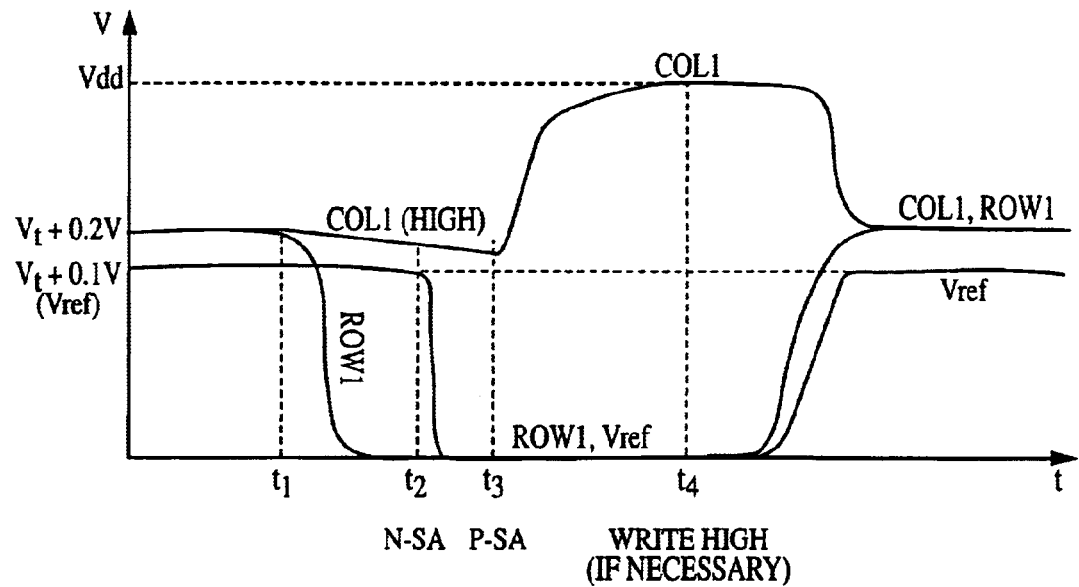
FIG. 9 depicts a timing diagram for reading a high resistance level at a programmable conductor element, in accordance with an exemplary embodiment of the invention.

Turning now to FIG. 9, a timing diagram describing a read operation in accordance with an exemplary embodiment of the invention is described. FIG. 9 is a timing diagram for reading a high resistance value in the programmable conductor memory element 114. Initially, all column lines and row lines of memory array 100 are at the same voltage (e.g., Vt+0.2v). At time $t_1$, a selected row line (e.g., 106) is brought to zero volts and the voltage at column line 104 discharges through the programmable conductor memory element 114 of the selected memory cell 108. At time $t_2$, the N-sense amplifier 700 is enabled and a comparison is made between the voltage at column line 104 and the voltage on the Vref line 194. If, as depicted here, the voltage at column line 104 is greater than Vref, then Vref is driven to ground and the programmable conductor memory element 114 is recognized as having a high resistance value. At time $t_3$, the P-sense amplifier 800 is enabled and compares Vref with the voltage level at column line 104. As mentioned earlier, since Vref was driven to ground and the voltage of column line 104 is floating, voltage at column line 104 is driven to a predetermined voltage (e.g., Vdd) and a logic HIGH state is read for the element 114. Since the voltage at row line 106 remains at zero volts, a large enough voltage potential difference is seen across programmable conductor memory element 114 so as to enable a reprogramming of its contents, if necessary. Subsequently, all row lines and column lines are brought to the same voltage value for a next read operation via precharge circuits 116 and 118. In addition, Vref is returned back to Vt+0.1v from ground, where it was driven to by the N-sense amplifier 700. As described above in connection with FIG. 1, this may be achieved with Vref precharge circuit 192.

Figure 10:
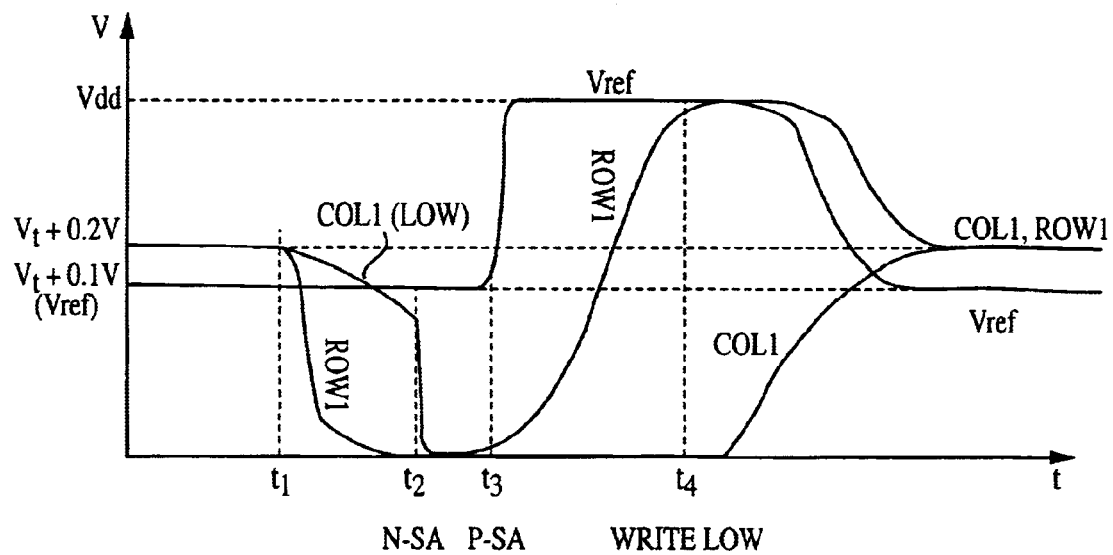
FIG. 10 depicts a timing diagram for reading a low resistance level at a programmable conductor element, in accordance with an exemplary embodiment of the invention.

Turning to FIG. 10, a timing diagram for reading a low resistance value in programmable conductor memory element 114 is depicted. As in FIG. 9, and as described above, all columns and rows are initially at the same voltage (e.g., Vt+0.2v) and at $t_1$, a selected row line (e.g., 106) is brought to zero volts. When the selected row line (e.g., 106) is brought to zero volts, a current flows through the programmable conductor memory element 114 of the selected memory cell 108 and the voltage of column line 104 discharges. At $t_2$, the N-sense amplifier 700 is enabled and compares the voltage at column line 104 with Vref. As depicted here, the voltage at column line 104 is lower than Vref (indicating that the programmable conductor memory element 114 contains a low resistance level) and therefore column line 104 is driven to ground and Vref remains at Vt+0.1v. At $t_3$, the P-sense amplifier is enabled and compares Vref (Vt+0.1v) with the voltage at column line 104 (now grounded). As a result, Vref is driven to a predetermined voltage, e.g., Vdd) and the voltage at column line 104 remains at ground. Here, the zero volts at column line 104 may be read as a logic "LOW" state.

The voltage at row line 106 is then raised to a predetermined voltage (e.g., Vdd) in order to enable a re-programming of the logic LOW state of the programmable conductor memory element 114. That is, by raising row line 106 to approximately Vdd, a sufficiently high voltage is seen across the programmable conductor element 114 so as to enable a programming operation. Subsequently, as described above, both the voltage at row line 106 and the voltage at column line 104 are brought to the same initial voltage (in fact, all column lines and all row lines of memory array 100 are brought to the same initial voltage), e.g., Vt+0.2v, for a next read operation via precharge circuits 116 and 118. Similarly, the Vref line 194 is returned back to e.g., Vt+0.1V. This may be achieved with Vref precharge circuit 192.

Figure 11:
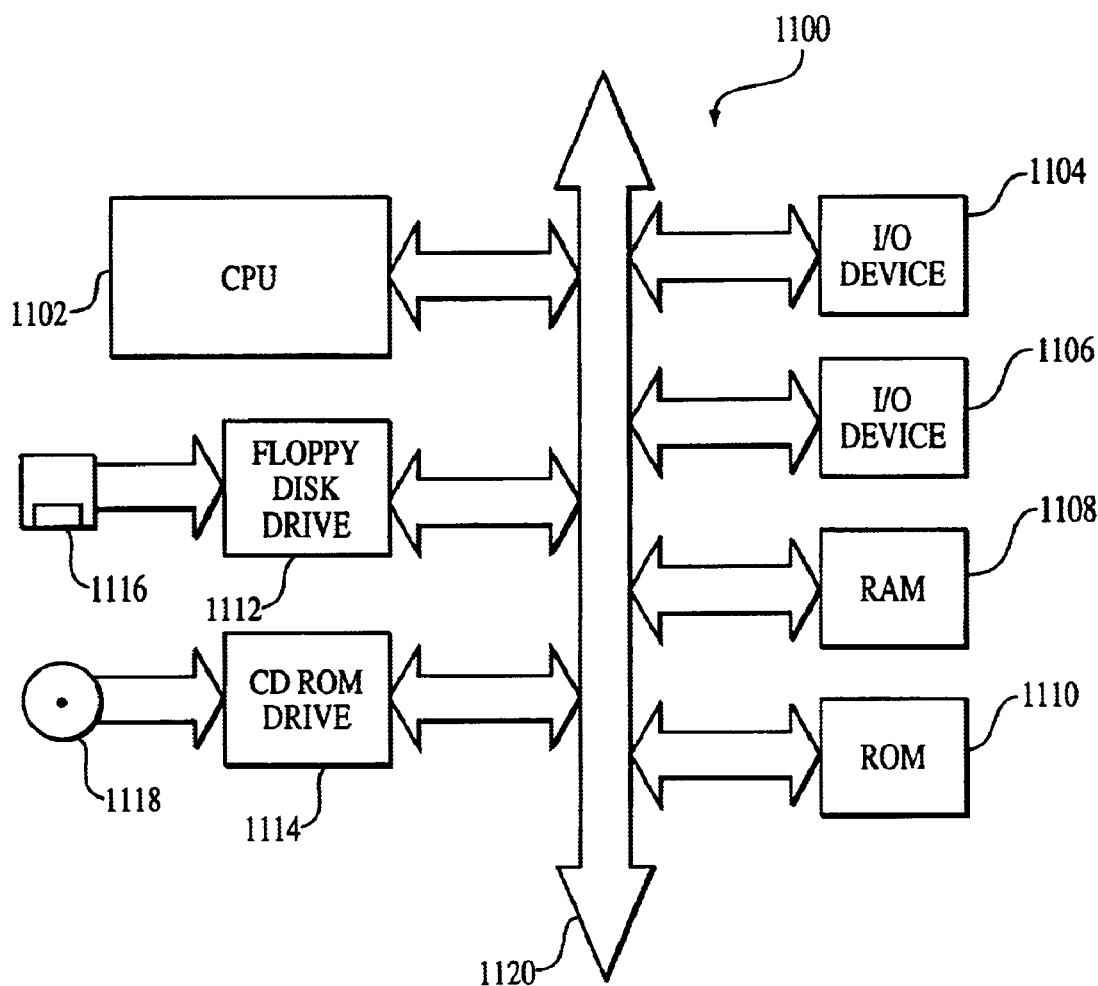
FIG. 11 depicts a block diagram of a processor-based system containing a PCRAM memory array, in accordance with an exemplary embodiment of the invention.

FIG. 11 illustrates a block diagram of a processor system 1100 containing a PCRAM semiconductor memory as described in connection with FIGS. 1–10. For example, the PCRAM memory array 100 described in connection with FIGS. 1–10 may be part of random access memory (RAM) 1108 and may be configured as one or more PCRAM memory circuits provided in a plug-in memoir module. The processor-based system 1100 may be a computer system or any other processor system. The system 1100 includes a central processing unit (CPU) 1102, e.g., a microprocessor, that communicates with floppy disk drive 1112, CD ROM drive 1114, and RAM 1108 over a bus 1120. It must be noted that the bus 1120 may be a series of buses and bridges commonly used in a processor-based system, but, for convenience purposes only, the bus 1120 has been illustrated as a single bus. All input/output (I/O) device (e.g., monitor)

1104, 1106 may also be connected to the bus 1120, but is not required in order to practice the invention. The processor-based system 1100 also includes a read-only memory (ROM) 1100 which may also be used to store a software program.

Although the FIG. 11 block diagram depicts only one CPU 1102, the FIG. 11 system could also be configured as a parallel processor machine for performing parallel processing. As known in the art, parallel processor machines can be classified as single instruction/multiple data (SIMD), meaning all processors execute the same instructions at the same time, or multiple instruction/multiple data (MIMD), meaning each processor executes different instructions.

The present invention provides a PCRAM cell 108 and a method for reading the logic state of a programmable conductor memory element 114 of the memory cell 108. According to an exemplary embodiment, the memory cell 108 consists of a first terminal of a programmable conductor memory element 114 coupled to a reverse connected diode pair 110, 112. Another terminal of the programmable conductor memory element 114 is coupled to a column line associated with the PCRAM cell 108. Another end of the reverse connected diode pair 110, 112 is coupled to a row line associated with the PCRAM cell 108.

Initially, all rows and columns of the memory array 100 are precharged to the same voltage potential (e.g., Vt+V). A row line is selected by bringing it to ground (e.g., approximately 0v). V is selected so that when Vt is across the diode pair 110, 112, a voltage sufficient to read the contents of the memory element 114, but insufficient to program the memory element 114, is across the memory element 114.

A predetermined time after a selected row line is brought to 0 v and current begins to flow through the programmable conductor memory element 114, a comparison is made between the voltage of the column line (e.g., 104) and the reference voltage, Vref. If the voltage at the column line is greater than Vref, then Vref is driven to ground and a high resistance level is recognized for the memory element 114. If the voltage at the column line is lower than Vref, then the column line is driven to ground and a low resistance level is recognized for the memory element 114. A predetermined time after such comparison is made, another comparison is made between the same two values and the contents of the programmable conductor memory element 114 are read.

For example, if Vref was driven to ground, then the voltage at the column line 104 is driven to Vdd and e.g., a logic HIGH level is read for the programmable conductor memory element 114. If the column line was driven to ground, then Vref is driven to Vdd and e.g., a logic LOW level is read for the programmable conductor memory element 114.

The voltage across the PCRAM cell 108 is then raised so as to increase the voltage potential difference across the memory element 114 to a level sufficient for programming (e.g., reprogramming a low resistance level for programmable conductor memory element 114 after a read operation).

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with specific voltage levels, it should be readily apparent that any other voltage levels can be selected to achieve the same results. In addition, although the invention has been described in connection with specifically placed n-type and p-type CMOS transistors, it should be readily apparent that the inverse of these CMOS transistors can be used instead. Furthermore, although the invention is described in connection with a reverse connected diode pair 110, 112 coupled between the programmable conductor memory element 114 and the row line 106, the reverse connected diode pair 110, 112 can be moved to a location between the programmable conductor memory element 114 and the column line 104. In addition, although an exemplary embodiment of the invention depicts the zener diode 300 with a certain orientation in the circuit, that orientation may be reversed and the location of the zener diode moved to the other side of the programmable conductor memory element 114.

Furthermore, although the invention is described as reducing the voltage at a selected row line to approximately zero volts, it may be the column line that is reduced to approximately zero volts. In the alternative, either one of the row low or column line may be increased to create a voltage potential difference across selected memory cell 108. Accordingly, the invention is not limited by the foregoing description or drawings, but is only limited by the scope of the appended claims.

What is claimed as new and desired to be protected by Letters Patent of the United States is:

1. A method of sensing a stored value of a programmable conductor random access memory element, the method comprising:

setting a row line and a column line associated with said memory element to respective voltage levels such that no current flows through said memory element;

changing the voltage at one of said row line and said column line to a level sufficient to initiate current flow through said memory element;

discharging the voltage level at the other of said row line and said column line through said memory element and also through a reverse connected diode pair in series with said memory element; and comparing the voltage on said other of said row line and said column line with a reference voltage to determine a logical state of said memory element.

2. The method of claim 1, wherein said act of setting comprises setting said row line and said column line to a common voltage level.

3. The method of claim 1, wherein said act of setting comprises setting a plurality of row lines and a plurality of column lines in a memory array with which said memory element is associated to a common voltage level.

4. The method of claim 1, wherein said act of changing comprises changing the voltage at said row line to approximately zero volts.

5. The method of claim 2, wherein said act of setting comprises setting said row line and said column line to a voltage level approximately equal to a threshold voltage of a diode of said diode pair plus an additional voltage sufficient to enable a read operation of said memory element.

6. The method of claim 1, wherein said act of setting comprises precharging said row line and said column line to said respective voltage levels.

7. The method of claim 2, wherein said act of setting comprises precharging said row line and said column line to said common voltage.

8. The method of claim 7 further comprising equilibrating said voltage on said row line and said column line.

9. The method of claim 1, wherein said act of changing comprises changing said voltage level at one of said row line and said column line such that a potential voltage difference across a programmable conductor memory cell containing said programmable conductor memory element is at least equal to a threshold voltage of an isolation diode of said memory cell coupled to said programmable conductor memory element plus a voltage sufficient to enable a read operation of said memory element.

10. The method of claim 1, wherein said act of comparing comprises discharging a voltage level, at the one of said row line and said column line that did not change, through said memory element.

11. The method of claim 1, wherein said act of comparing comprises comparing a voltage at said column line with said reference voltage a predetermined time after said act of changing.

12. The method of claim 1, wherein said act of comparing comprises comparing a voltage level at said column line with said reference voltage in order to determine said logical state.

13. The method of claim 1, wherein said act of changing comprises changing said voltage at one of said row line and said column line in order to have a voltage potential difference across said memory element sufficient to read said logical state, but insufficient to program said memory element.

14. The method of claim 1 further comprising reading a high resistance level for said programmable conductor memory element.

15. The method of claim 1 further comprising reading a low resistance level for said programmable conductor memory element.

16. The method of claim 15 further comprising reprogramming said low resistance level into said memory element.

17. The method of claim 16, wherein said act of reprogramming comprises raising a voltage at one of said column line and said row line to a level sufficient to place a programming voltage across said memory element sufficient to program said element to a low resistance state.

18. A method of sensing a stored value of a programmable conductor random access memory element, the method comprising:

setting a plurality of row lines and a plurality of column lines associated with a memory array to a common voltage such that no current flows through said memory element;

changing the voltage at a selected row line to approximately zero volts such that a current flow is initiated from a column line associated with said memory element through said memory element and through a reverse connected diode pair coupled to said memory element; and comparing the voltage at said column line with a reference voltage a predetermined time after said act of changing in order to determine a logical state of said memory element.

19. A method of sensing a stored value of a programmable conductor random access memory cell, the method comprising:

setting a column line and a row line associated with said memory cell to a common voltage level; and reducing said voltage at said row line to a level such that a reverse connected diode pair coupled to a programmed conductor memory element of said cell is activated and such that a voltage potential difference across said memory element is sufficient to read a logical state of said memory element, but insufficient to program said memory element.

20. A semiconductor memory structure, comprising:

a column line and a row line associated with a programmable conductor memory cell;

a programmable conductor memory element, a first terminal of which is coupled to said column line and a second terminal of which is coupled to a first side of a reverse connected diode pair, wherein a second side of said reverse connected diode pair is coupled to said row line; and a sense amplifier for comparing a voltage on said column line with a reference voltage during a read operation to determine a logical state of said programmable conductor memory element.

21. The structure of claim 20 further comprising precharge circuits for respectively precharging said column line and said row line to a common predetermined voltage level prior to said read operation.

22. The structure of claim 21 further comprising equilibrate circuits for respectively equilibrating voltages at said column line and said row line to said common predetermined voltage.

23. The structure of claim 21, wherein said common predetermined voltage is approximately equal to a threshold voltage of said diode circuit plus an additional voltage sufficient to read said logical state of said programmable conductor memory element.

24. The structure of claim 20, wherein said programmable conductor memory element comprises a chalcogenide glass having first and second electrodes.

25. The structure of claim 24, wherein said chalcogenide glass has a Ge:Se glass composition which is doped with Ag.

26. The structure of claim 20 further comprising a switch between said row line and said precharge circuit for switchably coupling said row line to said precharge circuit before said read operation.

27. A processor system, comprising:

a processor; and a semiconductor memory structure coupled to said processor, said semiconductor memory structure comprising:

a column line and a row line associated with a programmable conductor memory cell;

a programmable conductor memory element, a first terminal of which is coupled to said column line and a second terminal of which is coupled to a first side of a reverse connected diode pair, wherein a second side of said reverse connected diode pair is coupled to said row line; and a sense amplifier for comparing a voltage on said column line with a reference voltage during a read operation to determine a logical state of said programmable conductor memory element.

28. The system of claim 27, wherein said semiconductor memory structure further comprises precharge circuits for respectively precharging said column line and said row line to a common predetermined voltage level prior to said read operation.

29. The system of claim 28, wherein said semiconductor memory structure further comprises equilibrate circuits for respectively equilibrating voltages at said column line and said row line to said common predetermined voltage.

30. The system of claim 28, wherein said common predetermined voltage is approximately equal to a threshold voltage of said diode circuit plus an additional voltage sufficient to read said logical stare of said programmable conductor memory element.

31. The system of claim 27, wherein said programmable conductor memory element comprises a chalcogenide glass having first and second electrodes.

32. The system of claim 31, wherein said chalcogenide glass has a Ge:Se glass composition which is doped with Ag.

33. The system of claim 27, wherein said semiconductor memory structure further comprises a switch between said row line and said precharge circuit for switchably coupling said row line to said precharge circuit before said read operation.

34. A method of sensing a stored value of a programmable conductor memory element, the method comprising:
setting a row line and a column line associated with said memory element to respective voltage levels such that no current flows through said memory element;
changing the voltage at one of said row line and said column line to a level sufficient to initiate current flow through said memory element;
discharging the voltage level of the other of said row line and said column line through said memory element and also through a zener diode in series with said memory element; and
comparing the voltage on said other of said row line and said column line with a reference voltage to determine a logical state of said memory element.

35. The method of claim 34, wherein said act of setting comprises setting said row line and said column line to a voltage level approximately equal to a threshold voltage of said zener diode plus an additional voltage sufficient to enable a read operation of said memory element.

36. A method of sensing a stored value of a programmable conductor memory element, the method comprising:
setting a plurality of row lines and a plurality of column lines associated with a memory array to a common voltage such that no current flows through said memory element; and
changing the voltage of a selected row line to approximately zero volts such that a current flow is initiated from a column line associated with said memory element through said memory element and through a zener diode coupled in series with said memory element.

37. A method of sensing a stored value of a programmable conductor random access memory cell, the method comprising:
setting a column line and a row line associated with said memory cell to a common voltage level; and
reducing said voltage at said row line to a level such that a zener diode coupled to a programmable conductor memory element of said cell is activated and such that a voltage potential difference across said memory element is sufficient so read a logical state of said memory element, but insufficient to program said memory element.

38. A method of sensing a stored value of a variable resistance memory element, the method comprising:
setting a row line and a column line associated with said memory element to respective voltage levels such that no current flows through said memory element;
changing the voltage at one of said row line and said column line to a level sufficient to initiate current flow through said memory element;
discharging the voltage level at the other of said row line and said column line through said memory element and also through a reverse connected diode pair in series with said memory element; and
comparing the voltage on said other of said row line and said column line with a reference voltage to determine a logical state of said memory element.

39. A semiconductor memory structure, comprising:
a column line and a row line associated with a variable resistance memory cell;
a variable resistive memory element, a first terminal of which is coupled to said column line and a second terminal of which is coupled to a first side of a reverse connected diode pair, wherein
a second side of said reverse connected diode pair is coupled to said row line; and
a sense amplifier for comparing a voltage on said column line with a reference voltage during a read operation to determine a logical state of said variable resistive memory element.

40. The method of claim 38, wherein said act of setting comprises setting said row line and said column line to a common voltage level.

41. The method of claim 38, wherein said act of setting comprises setting a plurality of row lines and a plurality of column lines in a memory array with which said memory element is associated to a common voltage level.

42. The method of claim 38, wherein said act of changing comprises changing the voltage at said row line to approximately zero volts.

43. The method of claim 40, wherein said act of setting comprises setting said row line and said column line to a voltage level approximately equal to a threshold voltage of said diode plus an additional voltage sufficient to enable a read operation of said memory element.

44. The method of claim 38, wherein said act of setting comprises precharging said row line and said column line to said respective voltage levels.

45. The method of claim 40, wherein said act of setting comprises precharging said row line and said column line to said common voltage.

46. The method of claim 45 further comprising equilibrating said voltage on said row line and said column line.

47. The method of claim 38, wherein said act of changing comprises changing said voltage level at one of said row line and said column line such that a potential voltage difference across a variable resistance memory cell containing said variable resistance memory element is at least equal to a threshold voltage of an isolation diode of said memory cell coupled to said variable resistance memory element plus a voltage sufficient to enable a read operation of said memory element.

48. The method of claim 38, wherein said act of comparing comprises discharging a voltage level, at the one of said row line and said column line that did not change, through said memory element.

49. The method of claim 38, wherein said act of comparing comprises comparing a voltage at said column line with said reference voltage a predetermined time after said act of changing.

50. The method of claim 38, wherein said act of comparing comprises comparing a voltage level at said column line with said reference voltage in order to determine said logical state.

51. The method of claim 38, wherein said act of changing comprises changing said voltage at one of said row line and said column line in order to have a voltage potential difference across said memory element sufficient to read said logical state, but insufficient to program said memory element.

52. The method of claim 38 further comprising reading a high resistance level for said variable resistance memory element.

53. The method of claim 38 further comprising reading a low resistance level for said variable resistance memory element.

54. The method of claim 53 further comprising reprogramming said low resistance level into said memory element.

55. The method of claim 54, wherein said act of reprogramming comprises raising a voltage at one of said column line and said row line to a level sufficient to place a programming voltage across said memory element sufficient to program said element to a low resistance state.

56. A method of sensing a stored value of a variable resistance memory element, the method comprising:
setting a plurality of row lines and a plurality of column lines associated with a memory array to a common voltage such that no current flows through said memory element;
changing the voltage at a selected row line to approximately zero volts such that a current flow is initiated from a column line associated with said memory element through said memory element and through a reverse connected diode pair coupled to said memory element; and
comparing the voltage at said column line with a reference voltage a predetermined time after said act of changing in order to determine a logical state of said memory element.

57. A method of sensing a stored value of a variable resistance memory cell, the method comprising:
setting a column line and a row line associated with said memory cell to a common voltage level; and
reducing said voltage at said row line to a level such that a reverse connected diode pair coupled to a variable resistance memory element of said cell is activated and such that a voltage potential difference across said memory element is sufficient to read a logical state of said memory element, but insufficient to program said memory element.

58. The structure of claim 39 further comprising precharge circuits for respectively precharging said column line and said row line to a common predetermined voltage level prior to said read operation.

59. The structure of claim 58 further comprising equilibrate circuits for respectively equilibrating voltages at said column line and said row line to said common predetermined voltage.

60. The structure of claim 58, wherein said common predetermined voltage is approximately equal to a threshold voltage of said diode circuit plus an additional voltage sufficient to read said logical state of said variable resistance memory element.

61. The structure of claim 39 further comprising a switch between said row line and said precharge circuit for switchably coupling said row line to said precharge circuit before said read operation.

62. A processor system, comprising:
a processor; and
a semiconductor memory structure coupled to said processor, said semiconductor memory structure comprising:
a column line and a row line associated with a variable resistance memory cell;
a variable resistance memory element, a first terminal of which is coupled to said column line and a second terminal of which is coupled to a first side of a reverse connected diode pair, wherein
a second side of said reverse connected diode pair is coupled to said row line; and
a sense amplifier for comparing a voltage on said column line with a reference voltage during a read operation to determine a logical state of said variable resistance memory element.

63. The system of claim 62, wherein said semiconductor memory structure further comprises precharge circuits for respectively precharging said column line and said row line to a common predetermined voltage level prior to said read operation.

64. The system of claim 63, wherein said semiconductor memory structure further comprises equilibrate circuits for respectively equilibrating voltages at said column line and said row line to said common predetermined voltage.

65. The system of claim 63, wherein said common predetermined voltage is approximately equal to a threshold voltage of said diode circuit plus an additional voltage sufficient to read said logical state of said variable resistance memory element.

66. The system of claim 62, wherein said semiconductor memory structure further comprises a switch between said row line and said precharge circuit for switchably coupling said row line to said precharge circuit before said read operation.

67. A method of sensing a stored value of a variable resistance memory element, the method comprising:
setting a row line and a column line associated with said memory element to respective voltage levels such that no current flows through said memory element;
changing the voltage at one of said row line and said column line to a level sufficient to initiate current flow through said memory element;
discharging the voltage level of the other of said row line and said column line through said memory element and also through a zener diode in series with said memory element; and
comparing the voltage on said other of said row line and said column line with a reference voltage to determine a logical state of said memory element.

68. The method of claim 67, wherein said act of setting comprises setting said row line and said column line to a voltage level approximately equal to a threshold voltage of said zener diode plus an additional voltage sufficient to enable a read operation of said memory element.

69. A method of sensing a stored value of a variable resistance memory element, the method comprising:
setting a plurality of row lines and a plurality of column lines associated with a memory array to a common voltage such that no current flows through said memory element; and
changing the voltage of a selected row line to approximately zero volts such that a current flow is initiated from a column line associated with said memory element through said memory element and through a zener diode coupled in series with said memory element.

70. A method of sensing a stored value of a variable resistance memory cell, the method comprising:
setting a column line and a row line associated with said memory cell to a common voltage level; and
reducing said voltage at said row line to a level such that a zener diode coupled to a variable resistance memory element of said cell is activated and such that a voltage potential difference across said memory element is sufficient to read a logical state of said memory element, but insufficient to program said memory element.

* * * * *

UNITED STATES PATENT AND TRADEMARK OFFICE
CERTIFICATE OF CORRECTION

PATENT NO. : 6,937,528 B2
DATED : August 30, 2005
INVENTOR(S) : Glen Hush et al.

It is certified that error appears in the above-identified patent and that said Letters Patent is hereby corrected as shown below:

Title page,
Item [56], References Cited, OTHER PUBLICATIONS,
"Michael N. Kozicki, Axon Technologies Corp. and Arizona State University, Presentation of Micron Technology, Inc., Apr. 6, 2000." should read
-- Michael N. Kozicki, Axon Technologies Corp. and Arizona State University, Presentation to Micron Technology, Inc., Apr. 6, 2000. --.

Column 8,
Line 67, "All" should read -- An --.

Column 13,
Line 4, "stare" should read -- state --.

Signed and Sealed this

Twenty-second Day of November, 2005

JON W. DUDAS
*Director of the United States Patent and Trademark Office*